Oct. 29, 1968 G. P. WILSON 3,408,571

TRANSISTORIZED HIGH-INPUT-IMPEDANCE AMPLIFIER

Filed Jan. 27, 1966

3 Sheets-Sheet 1

INVENTOR.
GEORGE PAUL WILSON

BY

Owen, Wickersham & Erickson

ATTORNEYS

INVENTOR.
GEORGE PAUL WILSON
BY
Owen, Wickersham & Erickson
ATTORNEYS

Oct. 29, 1968 G. P. WILSON 3,408,571

TRANSISTORIZED HIGH-INPUT-IMPEDANCE AMPLIFIER

Filed Jan. 27, 1966

3 Sheets-Sheet 3

INVENTOR
GEORGE PAUL WILSON
BY
Owen, Wickersham & Erickson
ATTORNEYS

United States Patent Office 3,408,571

Patented Oct. 29, 1968

3,408,571

TRANSISTORIZED HIGH-INPUT-IMPEDANCE AMPLIFIER

George Paul Wilson, San Anselmo, Calif. (5917 Fresno Ave., Richmond, Calif. 94804)

Continuation-in-part of application Ser. No. 330,116, Dec. 12, 1963. This application Jan. 27, 1966, Ser. No. 528,696

25 Claims. (Cl. 325—145)

ABSTRACT OF THE DISCLOSURE

A self-contained miniaturized assembly for a microphone and a high-impedance-input amplifier. A housing contains a condenser microphone, having first and second terminals, and an amplifier. The amplifier includes a field-effect transistor having a gate connected to the second terminal and having third and fourth terminals, an amplifier transistor having a base connected to the third terminal, an emitter, and a collector, a D-C power supply having a negative side and a positive side connected to the first terminal through a ground line, a first resistor connecting the negative side of the power supply to the third terminal, a signal output line connected to the second terminal through a second resistor, a third resistor connecting the signal output line to the ground line on the signal output terminal side of the second resistor, and a fourth resistor and a first capacitor connected in parallel between the signal output side of the third resistor and the fourth terminal and the collector in parallel. There may be a frequency-modulation transmitter in the same housing connected to the signal output line.

This application is a continuation-in-part of application Ser. No. 330,116, filed Dec. 12, 1963, now abandoned.

This invention relates to a high-input-impedance transistor amplifier for use with a high-impedance transducer such as a condenser microphone or a piezo-electric accelerometer where the invention can be used in place of the conventional electron-tube cathode follower.

Proper operation of a condenser microphone or other high-impedance transducer requires an extremely high input impedance, typically in the range of $10^9$ ohms or larger. Because of the inherent very high impedance of the condenser element of a condenser microphone, the electronic impedance-transforming device must be physically very close to the condenser element. Any significant length of cable or connectors between the actual condenser and the impedance-transforming amplifier results in a loss of signal and hence degradation of results. In the past this requirement has necessitated the placing of an electron-tube cathode-follower physically at the end of the microphone cable along with the condenser element, as in U.S. Patent No. 2,579,162 to Paul S. Veneklasen. The cable had to provide the electron-tube filament current and cathode current as well as to transmit the desired microphone signal; hence the cable had a minimum of five conductors and had special connectors. If the cable was long, the conductors had to be very heavy in order to carry the large current necessary for the electron-tube filament or heater. Also a special power supply had to be provided to supply the D.C. currents necessary for proper electron-tube operation.

Attempts to use conventional transistors in the emitter follower or common collector configuration, have failed, even with so-called "bootstrapping," to provide a transistor device equivalent to the electron-tube cathode follower, since conventional transistors provide input impedance no greater than in the range of $10^6$ to $10^7$ ohms.

One object of the invention is to provide a transistorized impedance transforming device that can be used to replace an electron-tube cathode follower and that provides an input impedance in the range of $10^9$ ohms (1,000 megohms) or higher.

Another object of the invention is to lighten the weight and reduce the size of the amplifier case for condenser microphones and similar transducers. The condenser microphone is, itself, very small, about the size of a stack of three or four dimes, but the electron-tube amplifier heretofore required immediately adjacent to it was many times larger than the microphone.

Condenser microphones have heretofore required a five-wire cable that led from the electron-tube amplifier and was heavy and bulky, and the cable connectors of the amplifier have also been heavy and bulky. Hence, a further object is to enable the use of a light-weight three-wire cable and a light-weight, compact three-terminal connector with condenser microphones and similar transducers. The heaviest wires are eliminated, because the transistor amplifier of this invention does not require heater or filament current.

Another object is to reduce the power supply requirements of a condenser microphone assembly. The special power supply, formerly required, is eliminated, and a small battery can be used instead.

Another object of one form of the invention is to provide for the first time for wireless operation of a condenser microphone, in the polarized or direct-analogue mode of operation, eliminating the lack of stability and dependability generally associated with wireless condenser microphones.

Another object is to provide an accoustical measurement device that stops working whenever a malfunction occurs, such as is caused by dampness in the microphone. This is preferred to below-standard operation that might pass unnoticed until it is too late.

A further object is to provide an impedance transformer, for high-impedance transducers, which has less ground noise than conventional electron-tube devices.

The present invention provides a transistor amplifier circuit using a type of transistor known as a field-effect transistor and sometimes called a unipolar transistor. My new electrical circuit takes advantage of special properties of the field-effect transistor to provide an extremely high input impedance. Simultaneously, the circuit can provide the polarizing charge or voltage necessary to the operation of the condenser microphones.

The field-effect transistor differs from the conventional transistor in that it uses an electric field to control its output current; the conventional transistor uses a current from the control electrode to control its output current. The conventional transistor is a two-junction, three-terminal device, while the field-effect transistor is a single-junction, three-terminal device. There are two types of field-effect transistors, and both are usable in this invention. One type uses a bar or channel of P-type semi-conductor material, and near the center of the bar or channel and on both sides of it are N-type impurities forming P-N junctions or gate regions. When a battery or power supply is connected across the ends of the P-type channel, a current flows through the channel. The magnitude of the current depends upon its conductance area; by applying a reverse-bias voltage to the N-type gate regions, the effective conductance area of the P-type bar can be reduced because a space charge region or depletion layer is created in the space around the junctions and within the P-type channel. The net effect is that the conductance, and hence the current flow from one end of the P-type channel to the other end, is controlled by the voltage applied to the N-type gate. The gate voltage thus controls the effective area of the P-type bar or channel and therefore controls the output current of the device. In the other type of field-effect-transistor, the bar or channel is of the N-type material and the gate is of P-type material; similar results are obtained. Since the only current required to control the output current of either type of field-effect transistor is that which leaks through the reverse-biased gate to the channel junction, a high input resistance is obtained, and the device is almost a voltage-driven active circuit element. I explain below how my circuit takes advantage of the properties of field-effect transistors. It should be noted, however, that conventional field-effect transistor circuits give input impedances several orders of magnitude less than my new circuit.

The invention is, in general terms, an impedance transforming device for use with transducers requiring extremely high input impedance amplifiers. While primarily the device is intended for use with condenser (capacitor) type transducers, other applications of the transistor circuit include use with crystal microphones, accelerometers, capacitor displacement gages, and, in short, any electrical device which normally requires a very high input impedance amplifier to provide proper operation. This invention provides input impedances of magnitudes similar to those obtained with electron-tube cathode followers and much greater than can be obtained with conventional field-effect-transistor circuits or with an emitter-follower or other circuits using ordinary two-junction transistors. Moreover, simultaneously with providing high input impedance, the polarizing charge (or polarizing voltage) for condenser microphones provided by direct coupling.

Other objects and advantages of the invention will become apparent from the following detailed description of some preferred forms of the invention. Details of the description and the drawings are furnished for purposes of illustration of the invention and are not intended to imply limitation of the invention to these embodiments.

Figure 1:
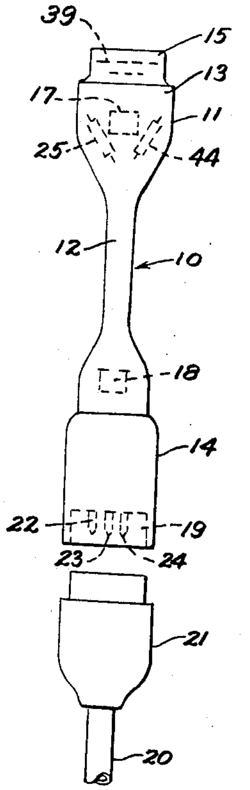
FIG. 1 is a view in elevation of a condenser microphone system embodying the principles of the invention.

A condenser-microphone assembly 10 is shown in FIG. 1 at substantially full scale. A small electrically conductive tubular housing 11 is employed; it may be, as shown, rather hour-glass shape with a narrow neck 12 between two enlarged ends 13 and 14, or, if desired, it may be cylindrical. A condenser microphone 15 is carried in one end 13, and my amplifier is within the housing 11, including a field-effect transistor 17 close to the microphone 15 and an amplifier transistor 18 in the end 14. A three-terminal plug 19 is provided at the end 14 for connection to a light-weight three-wire cable 20 having a three-terminal socket 21. The plug 19 has terminals 22, 23 and 24.

The microphone 15 is preferably a small capacitor microphone of the type used by the broadcast, movie, recording, and entertainment industries and also used for precision acoustical measurements of all types. These microphones have capacitances in the range of 5 micro-microfarads to 100 micro-microfarads, requiring amplifier input impedances in the range of 1000 megohms and higher to maintain uniform or flat frequency response for low audio frequencies. Acoustic measurements typically require uniform response to frequencies as low as the 20 to 30 cycle per second region.

The unit 10 provides a physical arrangement which satisfies the need for locating the impedance transforming device physically very close to the transducer 15, a requirement which must be met whether the impedance transforming device is an electron-tube or a solid-state device.

To generate a signal voltage due to applied sound pressure (or other means of moving one of the transducer plates) the transducer capacitor 15 needs a charge of electrons which remains constant. This charge is generally obtained by applying a high D.C. voltage, in the range of 50 to 400 volts, to the terminals of the transducer. The impedance of this D.C. voltage source must be very high in order to prevent the charge from leaking away as the voltage across the transducer terminals changes due to the mechanical motion of the movable plate 39. In this invention, the charge is provided through a resistor 25, as shown in FIG. 3, which typically has a value of 10 megohms (or a value in the range of 2 to 25 megohms); the circuit of this invention is so arranged that the effective value of the resistor 25 can be more than 2000 times its actual value.

Figure 3:
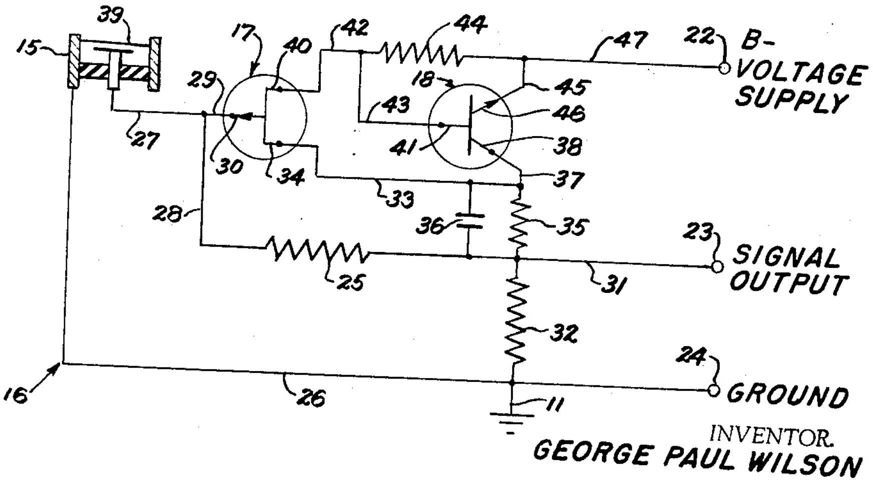
FIG. 3 is an electrical circuit diagram of one form of my new amplifier connected to a condenser microphone and employing a field-effect transistor with a P-type channel.
Figure 7:
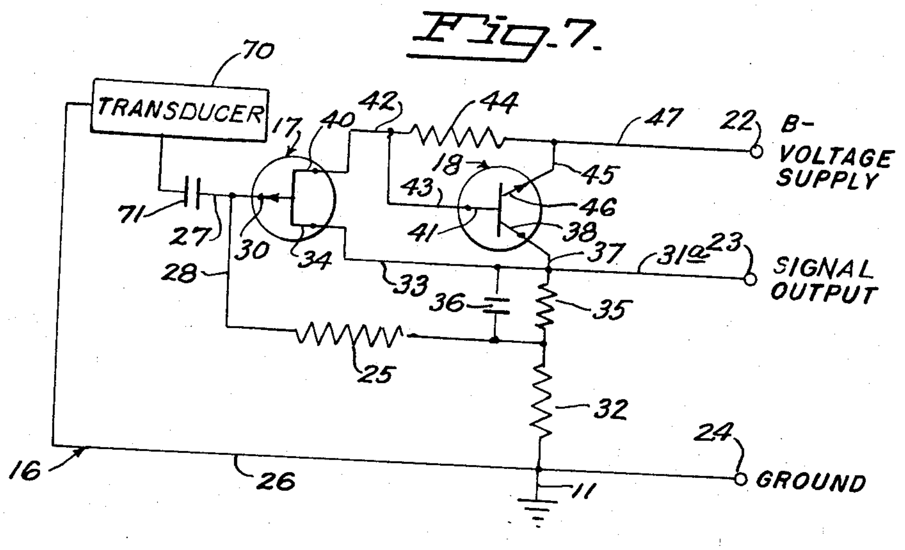
FIG. 7 is a diagram like FIG. 3 of a modified form thereof.

The circuit of FIG. 3 shows the amplifier that is within the housing 11 of FIG. 1. The plug prong or terminal 22 is connected to a B− voltage supply such as the negative terminal of a battery and the prong or terminal 24 is grounded, as through the case 11 and to the positive terminal of a battery. The signal output goes to the prong or terminal 23. One terminal of the condenser microphone 15 is connected by a lead 26 to the ground terminal 24, and the other terminal is connected by wire leads 27 and 28 to the resistor 25 and by leads 27 and 29 to the gate 30 of the field-effect transistor 17, which may typically be a 2N2498. The resistor 25 may be connected by a lead 31 to the signal output terminal 23, and a very important resistor 32 is connected across the leads 26 and 31. A typical value of the resistor 32 is 100,000 ohms. (FIG. 7 shows a circuit like FIG. 3 but with the signal output 23 being connected to the circuit by a lead 31a between the resistor 35 and the collector 38. There is no substantial difference in operation between FIGS. 3 and 7. In other words the signal output 23 may be connected to either end of the resistor 35. FIG. 7 also shows that with nonpolarized types of transducers, the transducer 70 is coupled through coupling capacitor 71.)

A lead 33 connects a terminal 34 of the field-effect transistor 17 to the resistor 32 through a resistor 35, having a typical value of 2,000 ohms. A condenser 36, typically 100 microfarad capacity, bridges the leads 33 and 31.

The resistor 35 is also connected by a lead 37 to the collector 38 of the transistor 18, which may typically be a 2N388A, while the terminal 40 of the field-effect transistor 17 is connected to the base 41 of the transistor 18 by leads 42 and 43. A resistor 44 is connected to the junction of the leads 42 and 43, and the resistor 44 and a lead 45 from the emitter 46 of the transistor 18 are connected to a voltage supply lead 47 that goes to the voltage supply terminal 22.

The invention thus uses a specially connected field-effect transistor 17 to provide high input impedance as necessary for use with the condenser microphone 15 or other high impedance transducers. The special circuit provides extremely high input impedance, accomplishes impedance transformation, and simultaneously provides the necessary polarizing voltage for the capacitor microphone 15. The special and unusual properties of the circuit are obtained by using the single resistor 32 of relatively large value, common to the collector 38 of the output transistor 18 and the source (or drain) terminal 34 of the input field-effect transistor 17, by using the common electrode configuration of the transistor 18 and the field-effect transistor 17, and by using a relatively high power-supply voltage. The value of resistor 32 lies in the range of 1000 ohms to 5 megohms, and the power supply voltage lies in the range of 25 volts to 500 volts. To obtain proper operating conditions for these ranges it is only necessary to adjust the ratios of the values of the resistors 32, 25, 35, and 44. The range of the resistor 25 is 2 megohms to 25 megohms (typically 10 megohms) and the value of the resistor 35 depends on the values of the resistors 25 and 32. The value of the resistor 44 (typically 500 ohms) depends on the desired ratio of the current in the field-effect transistor 17 to that of the amplifying transistor 18. The larger the resistance of the resistor 44 can be made, consistent with current requirements of the amplifying transistor 18, the higher will be the input impedance of the circuit.

The polarizating voltage for the condenser microphone 15 is obtained as a result of the gate 30 of the field-effect transistor 17 seeking a voltage very close to the voltage of the source terminal 34. The gate bias is obtained by directly connecting the gate bias resistor 25 to the high voltage end of the resistor 32. By directly connecting one terminal of the capacitor microphone 15 to the gate terminal 30 of the field-effect transistor 17 and the other terminal of the capacitor microphone 15 to the circuit ground line 26, the condenser microphone 15 is charged with the necessary polarizing charge, and the signal is directly impressed on the amplifier input terminals.

Figures 4, 5, 6:
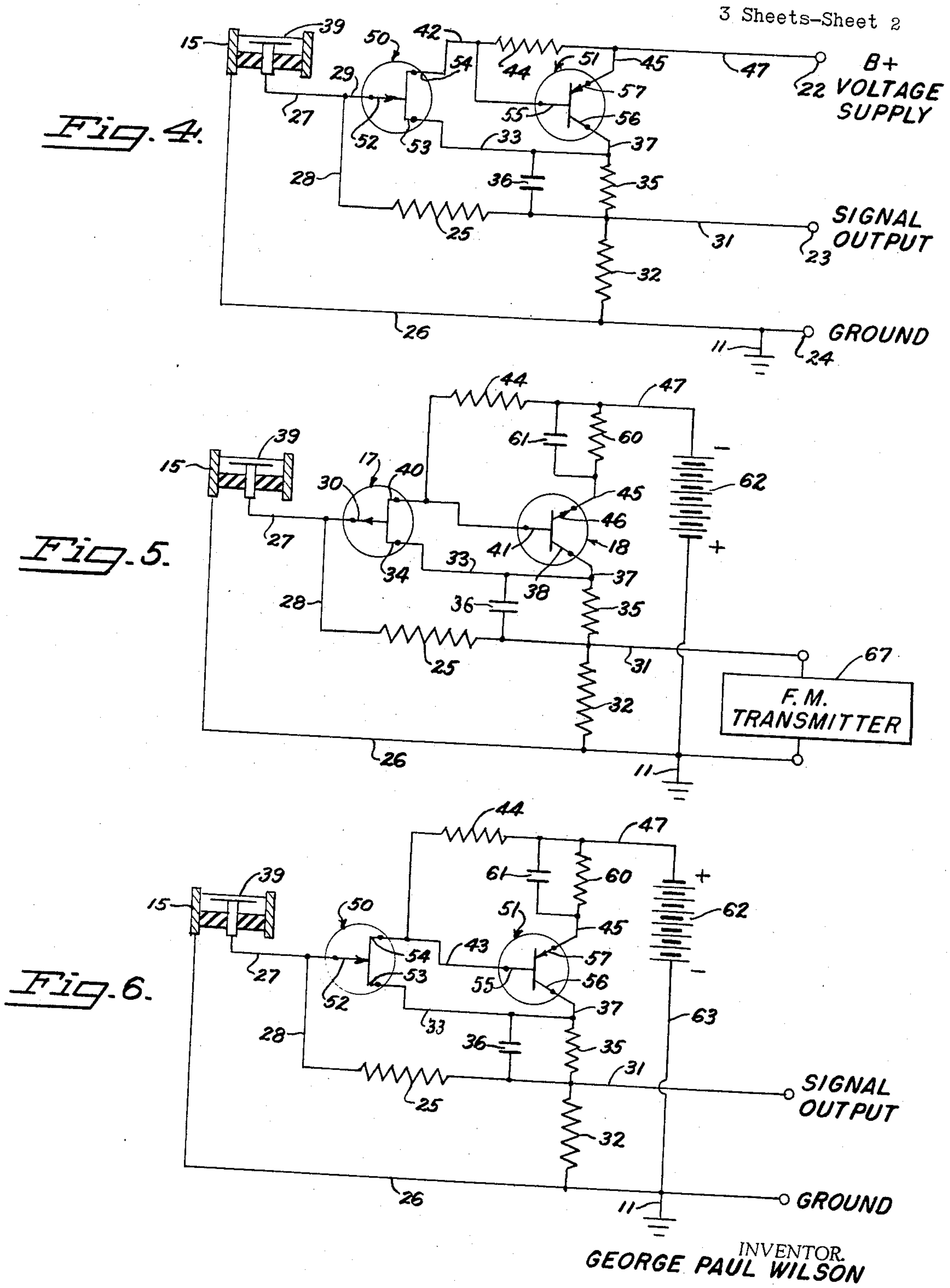
FIG. 4 is a view similar to FIG. 3 of a circuit using a field-effect transistor with an N-type channel.
FIG. 5 is an electrical circuit of a more elaborate form of my new circuit which provides input impedance much greater than $10^9$ ohms, i.e., $2\times10^{10}$ ohms, using a P-channel field-effect transistor.
FIG. 6 is a circuit diagram generally similar to FIG. 5 for a device using an N-channel field-effect transistor.

The circuit can be arranged to provide either a positive or a negative polarizing voltage on the condenser microphone 15. By using the P-channel field effect transistor 17 and an NPN-transistor 18, as in FIG. 3, a negative polarizing voltage for the microphone is obtained. By using an N-channel field-effect transistor 50 (with a gate 52, a source terminal 53, and a drain terminal 54) and a PNP-transistor 51, such as a 2N1377, with a base 55, a collector 56, and an emitter 57 connected to a B+ voltage source, as shown in FIG. 4, a positive polarizing voltage for the microphone 15 is obtained. The two versions give similar results in other respects, and the circuit values may be the same.

The high input impedance is obtained largely by the common electrode configuration and feed-back from the amplifying transistor 18 or 51 and partially from the inherent high input impedance of the field-effect transistor 17 or 50. The actual input impedance depends upon the gain of the amplifying transistor 18 (or 51), the magnitude of the common resistor 32 and the ratios of the resistances 32, 25, and 44. The resistance 35 serves only the purpose of adjusting for proper operating voltage and currents by adjusting the actual value of the field-effect transistor 17 (or 50) gate terminal D.C. bias voltage. The capacitor 36 is used to increase the feedback by bypassing alternating current signals around the resistor 35. The amount of feedback provided with the parameter values set forth herein is substantially but less than one hundred percent.

Silicon or germanium transistors may be used, however, the results are superior with silicon field-effect transistors. The input impedance is more than five times greater with silicon field-effect transistors than with germanium. The circuit self-noise is greatly reduced when a silicon field-effect transistor is used. When germanium field-effect transistors are used, the circuit is not self-protecting and is not self-diagnosing with regard to changes in polarizing voltage.

Figure 8:
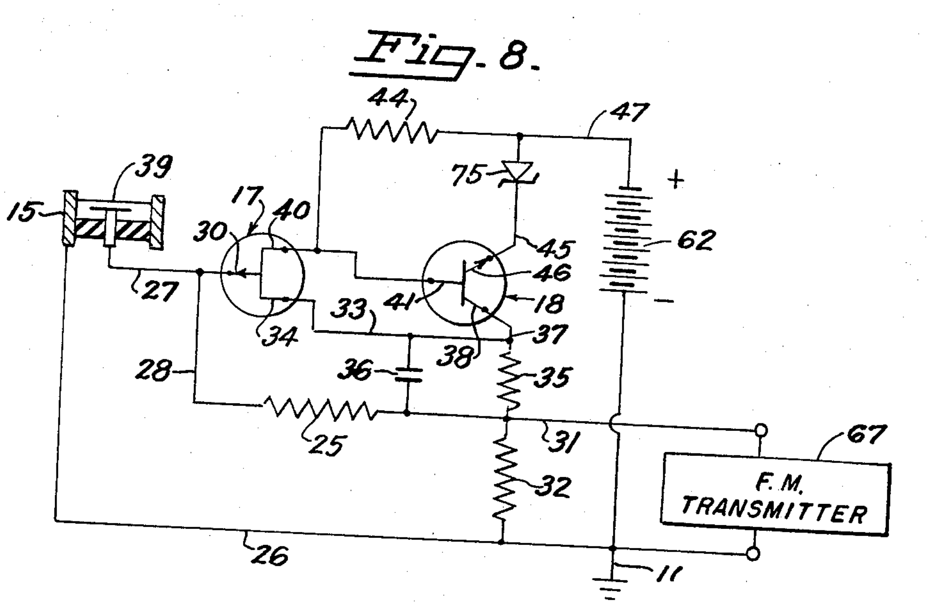
FIG. 8 is a circuit like FIG. 5 showing the use of a Zener diode as a biasing element.

By adding a resistor 60 and capacitor 61, as shown in FIGS. 5 and 6 (or a Zener diode 75, which is equivalent here, see FIG. 8), between the emitter 46 (or 57) and the hot line 47, the value of the resistor 44 may be greatly increased; hence the internal gain of the circuit can be increased considerably, and the input impedance can be increased considerably over that of the circuits of FIGS. 3 and 4. In such a circuit there can be such typical values as: resistor 60, 3300 ohms, condenser 61, 100 microfarads, resistor 44, 20,000 ohms, and resistor 35, 10,000 ohms, the other values typically being those already given. Of course, further amplification stages may be added to compound the effect, but then maintaining the circuit stability creates further problems.

The new transistor device of this invention thus eliminates the need for an electron tube at the end of the microphone cable 20. The amplifier gives performance equivalent or superior to the electron tube configuration and has advantages over it, including that of enabling the use of a smaller size housing 11 than was possible with the electron tube, since transistors are physically much smaller than tubes. This is a special advantage acoustically because the smaller size housing 11 creates less disturbance (diffraction effect) of the sound field around the microphone 15. Another advantage is that my new device requires only the three conductor cable 20 and uses a standard three-pin microphone cable connector 19 and 21 and therefore can be used with any standard dynamic microphone (or other balanced line) cable. Also, the power supply requirements are minimal since only a small collector current for the transistors 17 and 18 (or 50 and 51) is required. The device can easily be battery powered with long battery life.

Figure 2:
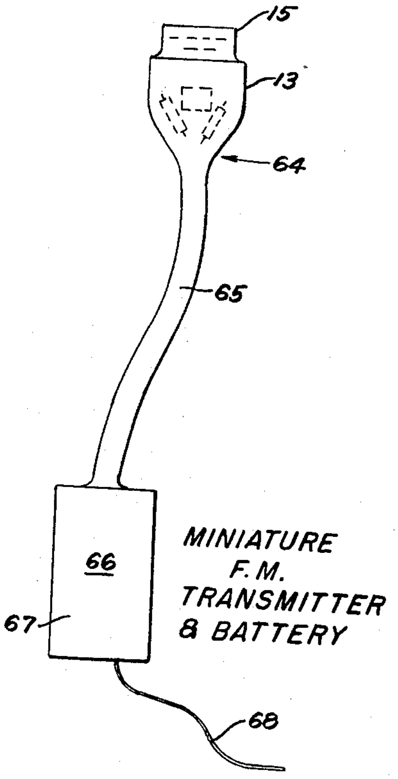
FIG. 2 is a similar view of a "wireless" microphone system also embodying the principles of the invention.

The new solid-state device has further advantages in that it makes possible, for the first time, the use of a polarized condenser microphone for the "wireless" type of microphone. FIG. 5 shows by way of example the incorporation of a small battery 62 connected to the hot line 47 and connected by a lead 63 to the ground line 26. FIG. 2 shows a housing 64 wherein a short narrow neck 65, two inches to two feet long connects the portion 13 (like that of FIG. 1) to a body portion 66 holding the transistor 18 (or 51), the battery 62, and an F-M transmitter 67. The same elements may, instead, utilize the circuits of FIG. 3 or 4. Whereas attempts to use the condenser element 15 as a variable element in the resonant circuit of a radio transmitter had heretofore been unsuccessful in practice, my new circuit enables the microphone 15 to be used in its normal manner—as a polarized capacitor—and provides an electrical signal to modulate the radio transmitter 67. This extends the usefulness of the "wireless" type of microphone so that it can now be used for precision measurements and higher quality sound pickup under any conditions where a "wireless" microphone is desired. Of course, the circuits of both FIGS. 5 and 6 can be used without the F-M transmitter 67 and with a three-wire cable 20, and this, too, has its advantages.

The present invention has the interesting feature, when used with a capacitor microphone 15 and a silicon field-effect transistor 17, in that it either operates correctly or does not operate at all. The electron tube circuit does not have this often advantageous property. This action is created, for example, when a condenser microphone 15 becomes damp because of humidity or other effects creating the presence of moisture, the insulation resistance is reduced and the electron charge may be conducted away causing a reduction (or loss) of polarizing voltage. With an electron tube circuit, this reduction of polarizing voltage causes a reduction in sensitivity of the microphone 15 but does not make it inoperative until the polarization is completely gone. In making acoustical measurements this effect can cause serious errors since the change in the polarization voltage may not be noticed. With the circuit of this invention any reduction in polarization voltage, caused by charge leakage due to dampness, etc., causes the field-effect transistor 17 to cease operating as an amplifier and to become effectively a Zener diode. The net effect is that a change in polarization voltage of the microphone that is sufficient to cause a significant change in the microphone sensitivity causes the microphone signal to disappear completely and be replaced by a constant-amplitude rushing noise, similar to the noise of a large waterfall. The presence of this noise then indicates that the microphone needs attention, and this indication prevents operation before any erroneous results can be obtained. This same effect makes the circuit self-protecting since the Zener diode mode of operation of the field-effect transistor 17 prevents any voltage of too large magnitude from ever being impressed across the transistors. Thus, a power supply voltage of twenty times the voltage rating of the transistors may be used, with no danger of burning out the transistors 17 and 18, barring, of course, direct short circuits.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A transducer amplifier assembly for use with a high-output-impedance transducer having a first grounded terminal and a second terminal, comprising:

a field-effect transistor having a gate electrode connected to said second terminal and having third and fourth terminals, an amplifier transistor having a base connected to said third terminal, an emitter connected to said third terminal through a first resistor, and a collector, means for connecting a power supply to said emitter, a signal output line connected to said second terminal and said gate electrode through a second resistor and and connected to ground through a third resistor, the ungrounded side of said third resistor being connected to said fourth terminal and to said collector through a fourth resistor.

2. The assembly of claim 1 wherein there is a capacitor in parallel with said fourth resistor.

3. The assembly of claim 1 wherein said means for connecting the power supply to the emitter, and the signal output line comprise a three-wire cable.

4. A high input impedance amplifier having a first grounded terminal and a second terminal, comprising:

a field-effect transistor having a gate electrode connected to said second terminal and having third and fourth terminals, an amplifier transistor having a base connected to said third terminal, an emitter connected to said third terminal through a first resistor, and a collector, means for connecting a power supply to said emitter, a signal output line connected to said second terminal and said gate electrode through a second resistor and connected to ground through a third resistor, the ungrounded side of said third resistor being connected to said fourth terminal and to said collector through a fourth resistor.

5. The amplifier of claim 4 wherein there is a capacitor in parallel with said fourth resistor.

6. An amplifier for use with a condenser microphone having first and second terminals, said first terminal being grounded, comprising:

a field-effect transistor having a gate electrode connected to said second terminal and having third and fourth terminals, an amplifier transistor having a base connected to said third terminal, an emitter, and a collector, a power supply connected to said emitter, a first resistor connecting said power supply to said third terminal, a signal output line having a signal output terminal and connected to said second terminal through a second resistor, a third resistor connecting said signal output line to ground on the signal output terminal side of said second resistor, and a fourth resistor and a capacitor connected in parallel between said signal output line on the signal output terminal side of said second resistor and said fourth terminal and said collector in parallel.

7. The amplifier of claim 6 wherein said signal output line is connected to an F-M transmitter, with the entire assembly being a self-contained unit requiring no wired connection outside of itself.

8. The amplifier of claim 6 wherein a parallel resistance-capacitance network connects said emitter to said power supply and to said first resistor.

9. A miniaturized amplifier assembly for a transducer having a first grounded terminal and a second terminal, a field-effect transistor having a gate electrode connected to said second terminal and third and fourth terminals, an amplifier transistor having a base connected to said third terminal, an emitter connected to said third terminal by a first resistor, and a collector, a power supply terminal connected to said emitter, a signal output line having a signal output terminal and connected to said second terminal through a second resistor, a ground terminal, a third resistor connecting said signal output terminal line to said ground terminal, and a fourth resistor and a capacitor connected in parallel between (a) the signal output side of said third resistor and (b) said fourth terminal and said collector in parallel, whereby a simple three-terminal plug can connect said power supply terminal, said ground terminal, and said signal output terminal to a simple three-wire cable.

10. The amplifier assembly of claim 9 wherein a resistance-capacitance network connects said emitter to said power supply terminal and to said first resistor.

11. A self-contained miniaturized assembly for a microphone, comprising:

a housing having first and second ends, a condenser microphone in said first end having first and second terminals, a field-effect transistor in said first end having a gate electrode connected to said second terminal and third and fourth terminals, an amplifier transistor in said housing having a base connected to said third terminal, an emitter, and a collector, a D-C power supply in said housing having a negative side and a positive side connected to said first terminal through a ground line, a first resistor in said first end connecting said negative side of said power supply to said third terminal, a signal output line in said housing connected to said second terminal through a second resistor in said first end, a third resistor in said housing connecting said signal output line to said ground line on the signal output terminal side of said second resistor, a fourth resistor and a first capacitor in said housing, connected in parallel between the signal output side of said third resistor and said fourth terminal and said collector in parallel, and a frequency-modulation transmitter in said housing connected to said signal output line.

12. The assembly of claim 11 having a fifth resistor and a second capacitor in parallel in said housing connected between said emitter and said negative side of said power supply and the power supply side of said first resistor.

13. A miniaturized amplifier assembly for an electrical device having a first grounded terminal and a second terminal, a field-effect transistor having a gate electrode connected to said second terminal and third and fourth terminals, an amplifier transistor having a base connected to said third terminal, an emitter connected to said third terminal by a first resistor, and a collector, a power supply terminal connected to said emitter, a signal output line having a signal output terminal and connected to said second terminal through a second resistor, a ground terminal, a third resistor connecting said second resistor to said ground terminal, and a fourth resistor and a capacitor connected in parallel between (a) the signal output side of said third resistor and (b) said fourth terminal and said collector in parallel, said signal output terminal being connected to one side of said fourth resistor, whereby a simple three-terminal plug can connect said power supply terminal, said ground terminal, and said signal output terminal to a simple three-wire cable.

14. The amplifier assembly of claim 13 wherein a resistance-capacitance network connects said emitter to said power supply terminal and to said first resistor.

15. A high input impedance amplifier having a first grounded terminal and a second terminal, a field-effect transistor having a gate electrode connected to said second terminal and third and fourth terminals, an amplifier transistor having a base connected to said third terminal, a collector connected to said fourth terminal, and an emitter connected to said third terminal by a first resistor, a power supply terminal connected to said emitter, a second resistor connected to said second terminal and to said collector through a third resistor, a fourth resistor connected from the junction of said second resistor and said third resistor to said first grounded terminal, a signal output line having a signal output terminal and connected to either end of said third resistor.

16. The amplifier of claim 15 wherein there is a capacitor in parallel with said third resistor.

17. The amplifier of claim 15 wherein a Zener diode, connects said power supply and said first resistor to said emitter.

18. The amplifier of claim 15 wherein a resistance-capacitance network connects said power supply and said first resistor to said emitter.

19. A microphone assembly, comprising:

a housing, a condenser microphone operated in the polarized mode in one end of said housing and having a first grounded terminal and a second terminal, and an amplifier assembly comprising:

a field-effect transistor having a gate electrode connected to said second terminal and having third and fourth terminals, an amplifier transistor having a base connected to said third terminal, an emitter connected to said third terminal through a first resistor, and a collector, means for connecting a power supply to said emitter, a signal output line connected to said second terminal and said gate electrode through a second resistor and connected to ground through a third resistor, the ungrounded side of said third resistor being connected to said fourth terminal and to said collector through a fourth resistor, whereby a simple three-terminal plug in the other end of said housing can connect said supply terminal, said ground terminal, and said signal output terminal to a simple three-conductor cable.

20. A self-contained miniaturized assembly for a microphone, comprising:

a housing, a condenser microphone in one end of said housing and having a first grounded terminal and second terminal, a field-effect transistor having a gate electrode connected to said second terminal and third and fourth terminals, an amplifier transistor having a base connected to said third terminal, a collector connected to said fourth terminal, and an emitter connected to said third terminal by a first resistor, a power supply terminal connected to said emitter, a second resistor connected to said second terminal and to said collector through a third resistor, a fourth resistor connected from the junction of said second resistor and said third resistor to said first grounded terminal.

a signal output line having a signal output terminal and connected to either end of said third resistor, a D-C power supply within said housing and having a negative side and a positive side connected to said first grounded terminal and said negative side connected to said power supply terminal, and a frequency-modulation transmitter in said housing connected to said signal output line.

21. In combination, a high input impedance semiconductor device having a current path defined by a source electrode and a drain electrode and having a gate electrode responsive to an electric potential thereon for controlling the current in said current path, a semiconductor device having a control electrode coupled to said drain electrode, an electron collecting electrode coupled to said source electrode and an electron emitting electrode, a voltage source coupled between said electron emitting electrode and a reference potential, a high impedance variable capacitance transducer coupled between said reference potential and said gate electrodes and means coupled between said reference potential and said gate electrode for providing a polarization voltage for said transducer, said means coupled between said gate electrode and said reference potential including resistive means coupled between said reference potential, said gate electrode and said electron collecting electrode.

22. In combination, a high input impedance semiconductor device having a current path defined by a source electrode and a drain electrode and having a gate electrode responsive to an electric potential thereon for controlling the current in said current path, a semiconductor device having a control electrode coupled to said drain electrode, an electron collecting electrode coupled to said source electrode and an electron emitting electrode, a voltage source coupled between said electron emitting electrode and a reference potential, a high impedance variable capacitance transducer coupled between said reference potential and said gate electrodes and means coupled between said reference potential and said gate electrode for providing a polarization voltage for said transducer, and feedback means responsive to signal current passing through said current path and said semiconductor device for feeding back substantially one hundred percent of the signal voltage to said gate electrode.

23. In combination, a high input impedance semiconductor device having a current path defined by a source electrode and a drain electrode and having a gate electrode responsive to an electric potential thereon for controlling the current in said current path, a semiconductor device having a control electrode coupled to said drain electrode, an electron collecting electrode coupled to said source electrode and an electron emitting electrode, a voltage source, coupled between said electron emitting electrode and a reference potential, and feedback means responsive to signal current passing through said current path and said semiconductor device for feeding back substantially one hundred percent of the output signal voltage to said gate electrode.

24. A combination as set forth in claim 23 wherein said feedback means includes a first resistor coupled between said reference potential and said electron collecting electrode and a second resistor coupled between said electron collecting electrode and said gate electrode.

25. A combination as set forth in claim 23 further including a high impedance variable capacitance transducer coupled between said reference potential and said gate electrode.

References Cited

UNITED STATES PATENTS

| | | | |
|---|---|---|---|
| 3,300,585 | 1/1967 | Reedyk | 179—1 |
| 2,705,287 | 3/1955 | Lo | 325—105 |
| 2,771,584 | 11/1956 | Thomas | 325—361 |
| 2,899,549 | 8/1959 | Potter | 325—105 |
| 3,082,380 | 3/1963 | Herrmann | 330—19 |

OTHER REFERENCES

Bignell, Electronics, Mar. 8, 1963, pp. 44–46, TK7800. E58 330–38FF.

Huang et al., Electronic Design, October 1955, pp. 42–45, TK7800.E51 330–38FE.

Lyles, Electronic Design, Nov. 22, 1963, pp. 71, 72, TK7800.E51 330–38FE.

"Product Survey-Field-Effect Transistor," Electronic Design, Apr. 26, 1963, pp. 66–69, TK7800.E51 330–38 FE.

ROBERT L. GRIFFIN, *Primary Examiner.*

A. J. MAYER, *Assistant Examiner.*